US007345325B2

(12) United States Patent
Nakaji et al.

(10) Patent No.: US 7,345,325 B2
(45) Date of Patent: *Mar. 18, 2008

(54) AVALANCHE PHOTODIODE (75) Inventors: Masaharu Nakaji, Tokyo (JP); Eitaro Ishimura, Tokyo (JP); Eiji Yagyu, Tokyo (JP); Nobuyuki Tomita, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 11/670,576

(22) Filed: Feb. 2, 2007

(65) Prior Publication Data

US 2007/0120226 A1 May 31, 2007

Related U.S. Application Data (63) Continuation of application No. 11/136,466, filed on May 25, 2005, now Pat. No. 7,187,013.

(30) Foreign Application Priority Data

Jul. 22, 2004 (JP) ............................. 2004-213973

(51) Int. Cl.
*H01L 31/72* (2006.01)
(52) U.S. Cl. ...................... 257/186; 257/199; 257/189; 257/184; 257/E29.18; 257/E29.334; 257/E29.335
(58) Field of Classification Search ................ 257/184, 257/186, 189, 199, E29.18, E29.334, E29.335
See application file for complete search history.

(56) References Cited

U.S. PATENT DOCUMENTS 6,104,047 A    8/2000  Watanabe 6,720,588 B2    4/2004  Vickers
7,187,013 B2 *  3/2007  Nakaji et al. ............... 257/186

FOREIGN PATENT DOCUMENTS

JP          2000-22197          1/2000

OTHER PUBLICATIONS

Watanabe, I. et al.; "Planar-structure Superlattice APDs", *Inst. of Electronics, Information and Communication Engineers*, Technical Report of IEICE, pp. 69-74, (Oct.1997).
Li, N. et al.l "InGaAs/InAlAs avalanche photodiode with undepleted absorber", *Applied Physics Letters*, vol. 82, No. 13, pp. 2175-2177, (Mar. 31, 2003).
Yonetsu, Hirho, "Optical Communication Element Engineering", Kokaku Tosho, Inc., (May 20, 2000).

* cited by examiner

*Primary Examiner*—Lynne Gurley
(74) *Attorney, Agent, or Firm*—Leydig, Voit & Mayer, Ltd.

(57) ABSTRACT

An avalanche photodiode has improved low-noise characteristics, high-speed response characteristics, and sensitivity. The avalanche photodiode includes a first conductivity type semiconductor layer, a second conductivity type semiconductor layer, a semiconductor multiplication layer interposed between the first conductivity type semiconductor layer and the second conductivity type semiconductor layer, and a semiconductor light-absorbing layer interposed between the semiconductor multiplication layer and the second conductivity type semiconductor layer. The avalanche photodiode further comprises a multiplication suppressing layer which suppresses multiplication of charge carriers in the semiconductor light-absorbing layer, located between the semiconductor light-absorbing layer and the second conductivity type semiconductor layer.

2 Claims, 7 Drawing Sheets

AVALANCHE PHOTODIODE

BACKGROUND OF THE INVENTION

1. Field of the Invention

The invention relates to an avalanche photodiode and, particularly, to an avalanche photodiode for optical communication.

2. Description of the Related Art

As avalanche multiplication type semiconductor light-receiving elements for optical communication, elements using InGaAs lattice-matching with InP in the light-absorbing layer are widely used (see, for example, Hirho Yonetsu, "Optical Commununication Element Engineering" Kogaku Tosho (K.K.)). In this avalanche photodiode (APD), either carrier of an electron-hole pair generated in the light-absorbing layer is accelerated by an electric field and injected into the multiplication layer. A high electric field is applied to the multiplication layer, where these injected electrons or holes are accelerated more and eventually ionized. The characteristics of the APD allows its important noise characteristics to be decided by the ionizing process of carriers in this multiplication process.

Specifically, if the ratio (ratio of ionization rates) of the electrons to holes ionized in this multiplication layer is increased, the noise characteristics are expected to be improved. Here, although the ionization rate ($\alpha$) of the electrons may be larger than the ionization rate ($\beta$) of the holes and vice versa, the ratio ($\alpha/\beta$ or $\beta/\alpha$) of ionization rates is preferably larger. Also, with regard to high-speed response characteristics which are important characteristics similarly to the noise characteristics, the ratio of ionization rates has a large influence thereon. The high-speed response characteristics are decided by the time constant defined by element resistance and element capacity, the time required for carriers to pass through the absorption layer and multiplication layer and the ratio of ionization rates. To tell the relation to the ratio of ionization rates, a larger ratio of ionization rates brings about better high-speed response characteristics.

However, the ratio of ionization rates is decided depending on the type of material When InP is used in the multiplication layer, the ionization rate of holes is large. However, the ratio ($\beta/\alpha$) of the ionization rates is about 2 at most. Therefore, APDs using AlInAs having a high ratio of ionization rates in the multiplication layer are being developed.

If this AlInAs is used in the multiplication layer, the ionization rate of electrons can be increased ($\alpha>\beta$) and an ionization rate of about 4 is obtained. Besides the above, researches and developments are made intensively to increase the ionization rate by making the multiplication layer have an AlInAs super lattice structure as reported in an article entitled "Planer Type Super Lattice APD" which is Isao Watanabe & 5 others, "Planer Type Super Lattice APD", Shingaku Giho, LQE97-79, 1997-10, pp 69-74.

However, when the multiplication in layers other than the multiplication layer is caused even if the ratio of ionization rates of the multiplication layer is improved, the ratio of ionization rates drops, causing deteriorations in noise characteristics and high-speed response characteristics. Particularly, in semiconductors having a narrow bandgap, multiplication is caused easily in a lower electric field. Therefore, multiplication takes place very easily in the case of InGaAs used for the light-absorbing layer in APDs for optical communication When multiplication takes place in InGaAs whose ratio ($\alpha/\beta$)of ionization rates is about 2, the ratio of ionization rates drops in APDs using InP which multiplies ($\beta>\alpha$) holes for the multiplication layer.

Also, in the case of APDs using AlInAs which multiplies ($\alpha>\beta$) electrons as in the case of InGaAs for the multiplication layer, the ratio of ionization rates drops because the ratio of ionization rates of AlInAs is about 4. For this, usual APDs are used in the situation where a high electric field is applied to the InGaAs absorbing layer, giving rise to the problem that noise characteristics are impaired. Moreover, supposing that a constant electric field is applied to the InGaAs absorbing layer, the multiplied carriers are increased and the ratio of ionization rates drops in the case of making the InGaAs absorbing layer thick. Therefore, in current APDs for communication, there is a tradeoff relation between sensitivity characteristics and noise characteristics and it is therefore difficult to attain the compatibility between sensitivity characteristics and noise characteristics.

Also, in high-speed response APDs, the running time of carriers generated in the depletion layer and the diffusion time of carriers generated in the non-depletion region largely affect high-speed response characteristics. As measures taken for this, there are, for example, methods in which the carrier density in an absorbing layer which is undepleted is changed to thereby control an internal electric field and the over-shooting speed of electrons are utilized to thereby shorten the diffusion time of carries as reported in Ning, Li, et. al. "InGaAs/InAlAs avalanche photo diode with undepleted absorber", Appl. Phys. Lett: 31, Mar. 2003).

However, because, in the above structure, impurities are added to the InGaAs absorbing layer region to form the non-depletion region, it is necessary to make thin the absorbing layer to obtain an electric field higher enough to cause the over-shooting of electrons in the whole absorbing layer region. However, if the absorbing layer is made thin, the light to be transmitted is increased, posing the problem that the sensitivity which is important characteristics for APDs is deteriorated.

Also, a Publication of JP-A No. 2000-22197 discloses an avalanche photodiode in which the semiconductor light-absorbing layer is constituted of two layers consisting of a depletion region which is adjacent to the semiconductor field limiting layer and has a thickness of 10 nm or more and 0.3 μm or less and a non-depletion region which is also adjacent to the semiconductor field limiting layer and has a thickness of 2 μm or less.

However, when light is incident from the upper surface of the element in usual, the incident light is almost absorbed in the semiconductor absorbing layer which is to be undepleted because the light-absorbing layer to be depleted is thin. In this case, the electron-hole pairs generated in the absorbing layer almost constitute diffusion current and therefore, it takes considerable time to draw the diffusion current as signals, leading to a deterioration in high-speed response characteristics. Also, these electron-hole pairs are recombined in the non-depletion region before the diffusion current is drawn as signals, posing the problem that the diffused current is not drawn as signals, causing a deterioration in receiving sensitivity.

SUMMARY OF THE INVENTION

As mentioned above, avalanche photodiodes must be used under high voltage and it is demanded of these avalanche photodiodes to have high sensitivity, low-noise characteristics and high-speed response characteristics. If the absorbing layer is made thick to better sensitivity, this gives rise to the problem that carriers multiplied in the absorbing layer are increased, resulting in deteriorations in noise characteristics and high-speed response characteristics.

Also, the absorbing layer must be made thin to improve low-noise characteristics and high-speed response characteristics, giving rise to the problem that sensitivity characteristics are sacrificed.

In view of the above situation, it is an object of the present invention to provide an avalanche photodiode which can be improved in low-noise characteristics and high-speed response characteristics and can provide high sensitivity.

The above object is attained by an avalanche photodiode according to the present invention, the avalanche photodiode comprising a first conductive type semiconductor layer, a second conductive type semiconductor layer, a semiconductor multiplication layer interposed between the first conductive type semiconductor layer and the second conductive type semiconductor layer and a semiconductor light-absorbing layer interposed between the semiconductor multiplication layer and the second conductive type semiconductor layer, the avalanche photodiode further comprising a multiplication suppressing layer which suppresses the multiplication of the semiconductor light-absorbing layer and has a thickness of 0.6 µm or less between the semiconductor light-absorbing layer and the second conductive type semiconductor layer, wherein the thickness of the semiconductor light-absorbing layer is set to 0.5 µm or more.

In the present invention, impurities are added in a high concentration to a part of the light-absorbing layer to form a non-depletion region (a multiplication suppressing layer is inserted), whereby an avalanche photodiode can be attained which can be reduced in working voltage, has high sensitivity and low-noise characteristics and can attain high-speed response under low voltage.

DETAILED DESCRIPTION OF THE PREFERRED EMBODIMENTS

Embodiment 1

First, a specific structure of an avalanche photodiode in an embodiment 1 will be clarified by way of brief explanations of a process of producing the avalanche photodiode of the embodiment 1 according to the present invention.

The avalanche photodiode of the embodiment 1 is a plane light-receiving type separated absorption and multiplication avalanche photodiode (SAM-APD (Separated absorption and Multiplication-Avalanche Photo Diode)).

Figure 1A:
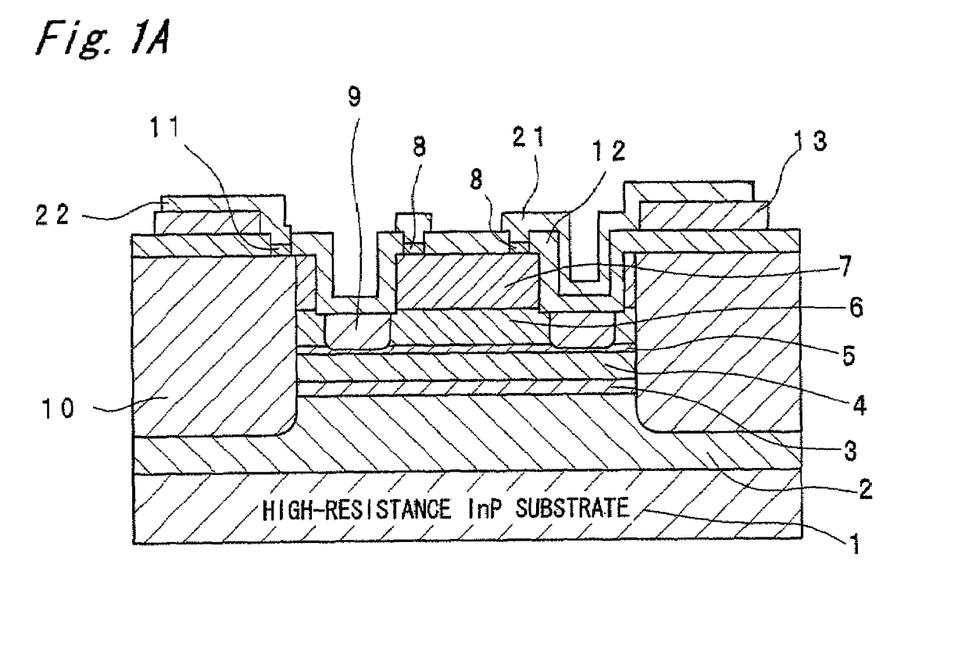
FIG. 1 is a sectional view of an avalanche photodiode in an embodiment 1 according to the present invention.
Figure 1B:
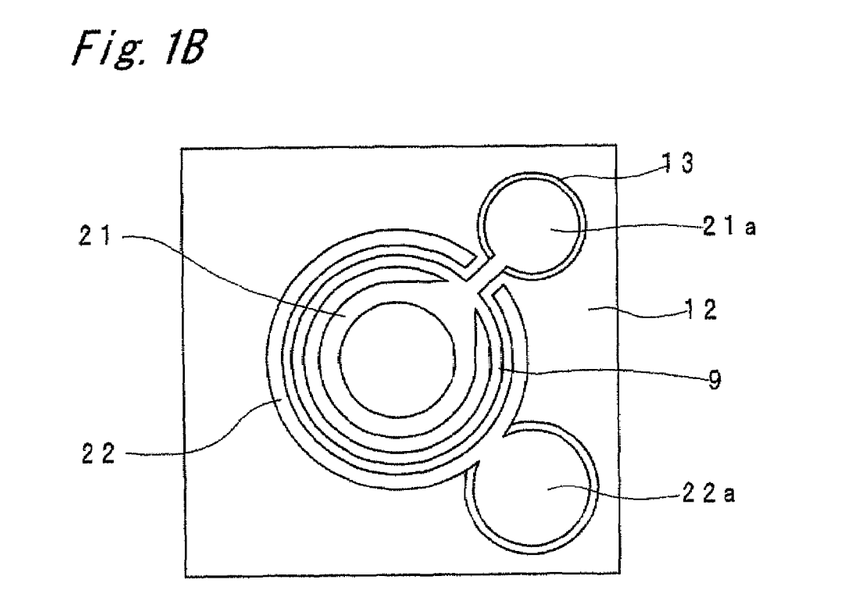

First, a p-type InP buffer layer 2 (Be: $5 \times 10^{18}$ cm$^{-3}$), a p-type InGaAs multiplication suppressing layer 3 (Be: $5 \times 10^{17}$ cm$^{-3}$), an i-type InGaAs light-absorbing layer 4, a p-type InP field limiting layer 5 (Be: $4.5 \times 10^{17}$ cm$^{-3}$), an i-type AlInAs multiplication layer 6, an i-type InP etching stopper layer (not shown), an n-type AlInAs cap layer 7 (Si: $5 \times 10^{18}$ cm$^{-3}$) and an n-type InGaAs contact layer 8 (Si: $5 \times 10^{18}$ cm$^{-3}$) are formed one by one by epitaxial growth. As a crystal growth method, a solid source or gas source MBE method, metalorganic chemical vapor deposition (MOCVD) method or the like is preferable.

It is to be noted that in the above examples, less diffusible Be is added as the impurities to be added to the multiplication suppressing layer. However, in the present invention, C, Mg, Si, S and the like which are likewise less diffusible may be added besides Be.

Next, the n-type InGaAs contact layer 8 and n-type AlInAs cap layer 7 around the part to be the light-receiving region are removed by selective etching using an aqueous mixed solution comprising an organic acid such as citric acid, aqueous hydrogen peroxide and water until the surface of the i-type InP etching topper layer is exposed. As a result, a cyclic groove surrounding the light-receiving region is formed. In this case, as the etching mask, a resist which is patterned by known lithographic technologies is used.

In succession, the cyclic groove region is ion-implanted with titanium (Ti) or the like to offset the effect of the p-type to a depth extending to the vicinity of the p-type InP limiting layer, followed by heat-treating at a temperature of 600° C. or more to activate the ions, thereby effectively reducing the carrier density in the p-type InP field limiting layer around the light-receiving region. This region 9 doped with Ti ions functions as a guard ring. With regard to the type of ion to be implanted, the same effect is also obtained by using elements such as H, He, Ne, C, O, Ar, B, Fe and Cr besides Ti.

Next, Zn is used as the source of impurities to diffuse Zn selectively to an outside region on the outside of the cyclic groove by a thermal diffusion method to transform the n-type AlInAs layer and the n-type InGsAs contact layer to a p-type AlInAs layer and a p-type InGaAs contact layer 11 respectively. Next, a part of each of the n-type InGaAs contact layer 8 and p-type InGaAs contact layer 11 is removed by selective etching to make these layer have desired shapes. Then, an antireflection film/passivation film 12 made of, for example, SiN$_x$ is formed on the surface of the wafer.

In the regions where the surface passivation film is selectively removed on each upper part of the n-type InGaAs contact layer 8 and the p-type InGaAs contact layer 11 formed into desired shapes, a first electrode 21 is formed on the n-type InGaAs contact layer 8 which is the light-receiving region and a second electrode 22 is formed at such a position as to surround the cyclic groove on the p-type InGaAs contact layer 11 on the outside of the light-receiving region by using an alloy such as AuZn, AuTi, AuTiPt or AuGeNi.

For connection with outside circuits, a first electrode bonding pad 21a and a second electrode bonding pad 22a that bond gold wires to the first electrode 21 and second electrode 22 respectively are formed, and a first electrode lead wire and a second electrode lead wire are formed between the first electrode 21 and the first electrode bonding pad 21a and between the second electrode 22 and the second electrode bonding pad 22a to electrically connect the both respectively. The major part of the APD as shown in FIG. 1 is completed through the processes as mentioned above.

The avalanche photodiode constituted in the above manner in the embodiment 1 is characterized by the formation of the p-type InGaAs multiplication suppressing layer 3 between the p-type InP buffer layer 2 and the i-type InGaAs light-absorbing layer, whereby the ratio of is ionization rates can be improved and the running time of carriers can be shortened.

The characteristics of the avalanche photodiode of the embodiment 1 will be explained hereinbelow by way of appropriately comparing the avalanche photodiode of the embodiment 1 provided with the p-type InGaAs multiplication suppressing layer 3 with an avalanche photodiode (FIG. 2) of a comparative example provided with no p-type InGaAs multiplication suppressing layer 3.

Figure 2:
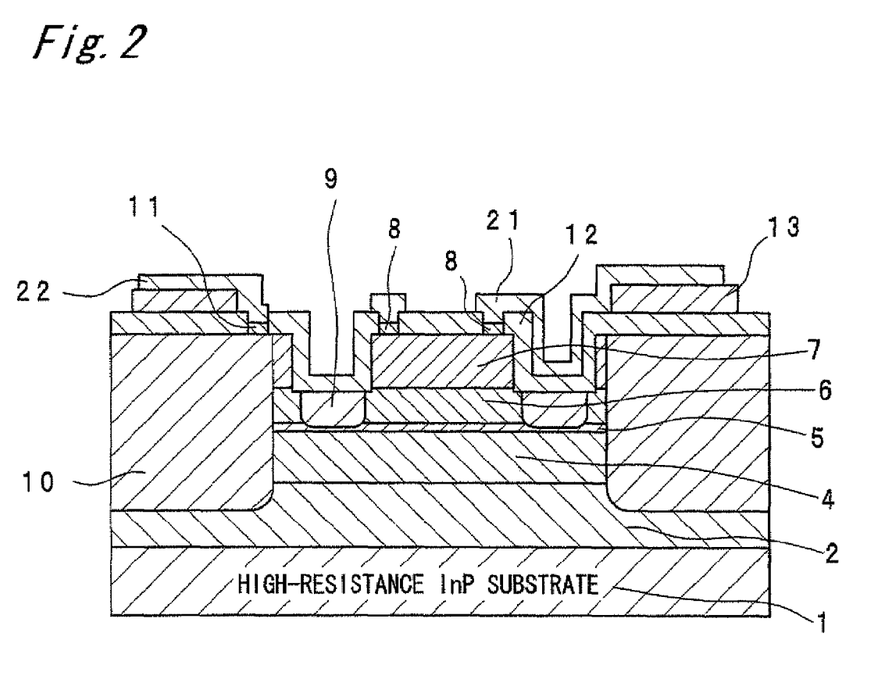
FIG. 2 is a sectional view of an avalanche photodiode in a comparative example.

First, each specific structure of the avalanche photodiodes of the embodiment 1 and the comparative example was assumed to evaluate field distribution and field strength in the vicinity of the multiplication layer 6.

The performance of the avalanche photodiode of the embodiment 1 was simulated based on the film thicknesses and carrier densities shown in Table 1 and the performance of the avalanche photodiode of the comparative example was simulated based on the film thicknesses and carrier densities shown in Table 2.

TABLE 1

|  | Film thickness (nm) | Carrier density ($cm^{-3}$) |
| --- | --- | --- |
| i-type AlInAs multiplication layer 6 | 200 | $5 \times 10^{14}$ |
| p-type InP field limiting layer 5 | 50 | $4.5 \times 10^{17}$ |
| i-type InGaAs light-absorbing layer 4 | 1000 | — |
| p-type InGaAs multiplication suppressing layer 3 | 300 | $5 \times 10^{17}$ |

TABLE 2

|  | Film thickness (nm) | Carrier density ($cm^{-3}$) |
| --- | --- | --- |
| i-type AlInAs multiplication layer 6 | 200 | $5 \times 10^{14}$ |
| p-type InP field limiting layer 5 | 50 | $4.5 \times 10^{17}$ |
| i-type InGaAs light-absorbing layer 4 | 1300 | — |

Figure 3:
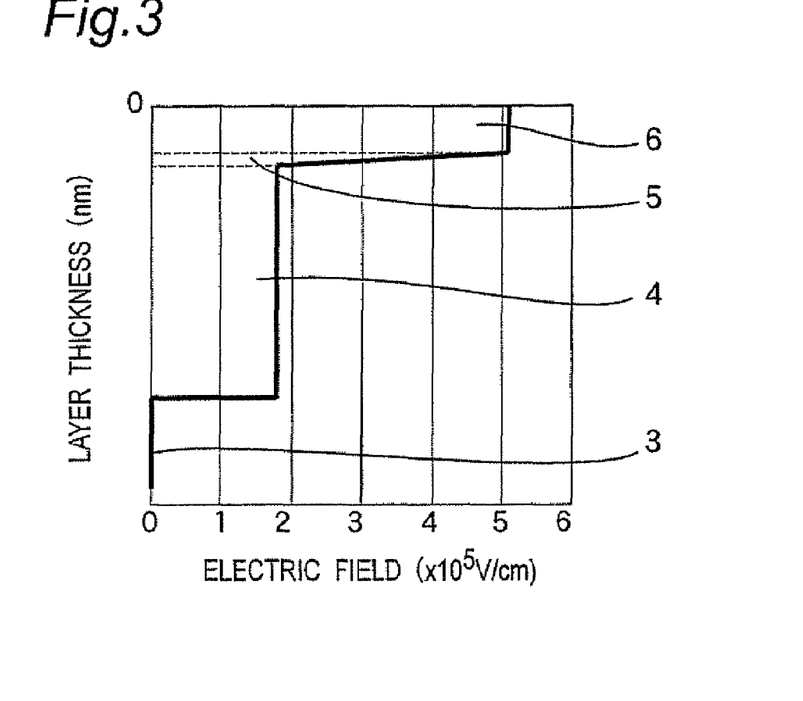
FIG. 3 is a graph showing a field distribution in the section of the avalanche photodiode of embodiment 1.
Figure 4:
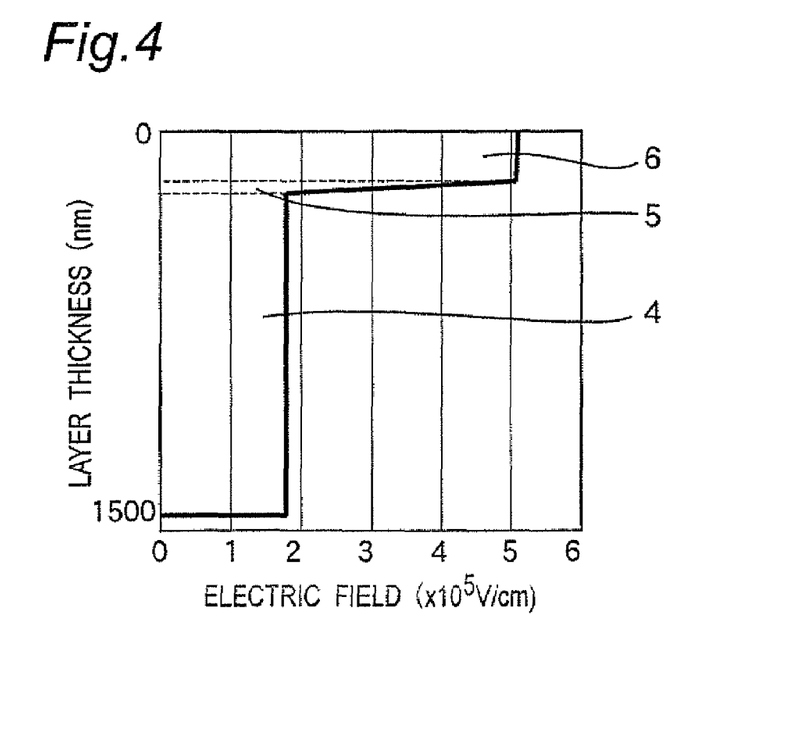
FIG. 4 is a graph showing a field distribution in the section of an avalanche photodiode in a comparative example.

The results of the simulation are shown in FIG. 3 (embodiment 1) and in FIG. 4 (comparative example).

The results of this simulation are based on calculation made using a field assumed to cause a multiplication of about 10 in the AlInAs multiplication layer 6.

In the embodiment 1 as shown in Table 1 and FIG. 3, the insertion of the InGaAs multiplication suppressing layer 3 makes thinner the i-type InGaAs light-absorbing layer 4, to which a high field is applied, than a conventional light-absorbing layer while the i-type InGaAs light-absorbing layer 4 and the p-type InGaAs multiplication suppressing layer are made to have a total thickness above a fixed level.

Specifically, in the avalanche photodiode of the embodiment 1, the i-type InGaAs light-absorbing layer 4 to be depleted is formed in a thickness more than a fixed level on the field limiting layer 5 side and the p-type InGaAs multiplication suppressing layer 3 which is a non-depletion semiconductor light-absorbing layer to be undepleted is formed on the opposite side, thereby forming the light-absorbing layer from the i-type InGaAs light-absorbing layer 4 to be depleted and the p-type InGaAs multiplication suppressing layer 3 to be undepleted.

This makes it possible to make thin the InGaAs light-absorbing layer 4 to which a field is applied while the thickness of the whole light-absorbing layer is maintained at more than a fixed level, and it is therefore possible to suppress multiplication in the InGaAs light-absorbing layer 4.

In the avalanche photodiode constituted in the above manner in the embodiment 1, the total thickness of the i-type InGaAs light-absorbing layer 4 and the p-type InGaAs multiplication suppressing layer is designed to be preferably in a range from 0.7 µm to 2.0 µm and more preferably in a range from 1 µm to 1.5 µm to prevent a deterioration in light absorbance.

Also, the concentration of impurities in the p-type InGaAs multiplication suppressing layer 3 is designed to be preferably $5 \times 10^{16}$ $cm^{-3}$ or more and more preferably $5 \times 10^{17}$ $cm^{-3}$ or more to prevent the layer 3 from being depleted.

Figure 5:
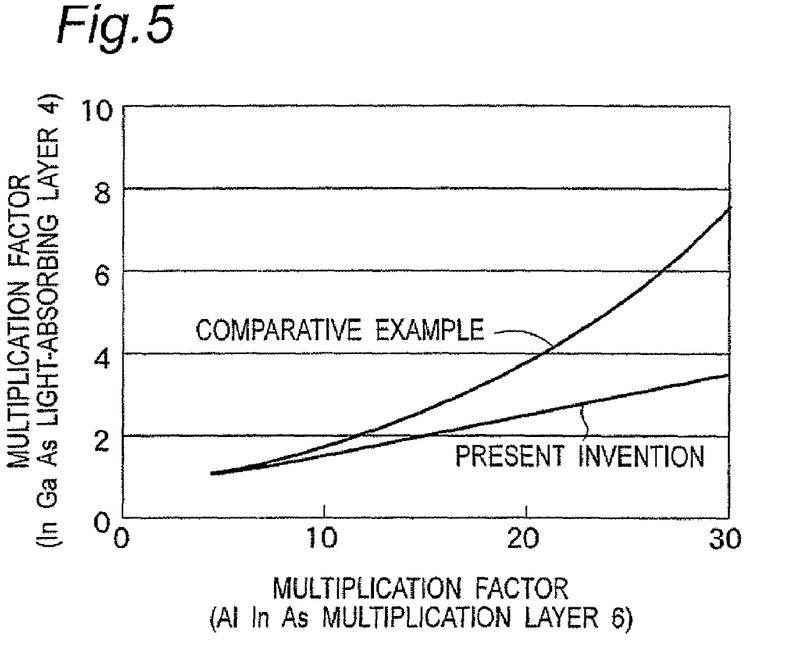
FIG. 5 is a graph showing the relation between the multiplication factor of a multiplication layer 6 and the multiplication factor of a light-absorbing layer 4 in the avalanche photodiode of embodiment 1 in contrast to that of a comparative example.
Figure 6:
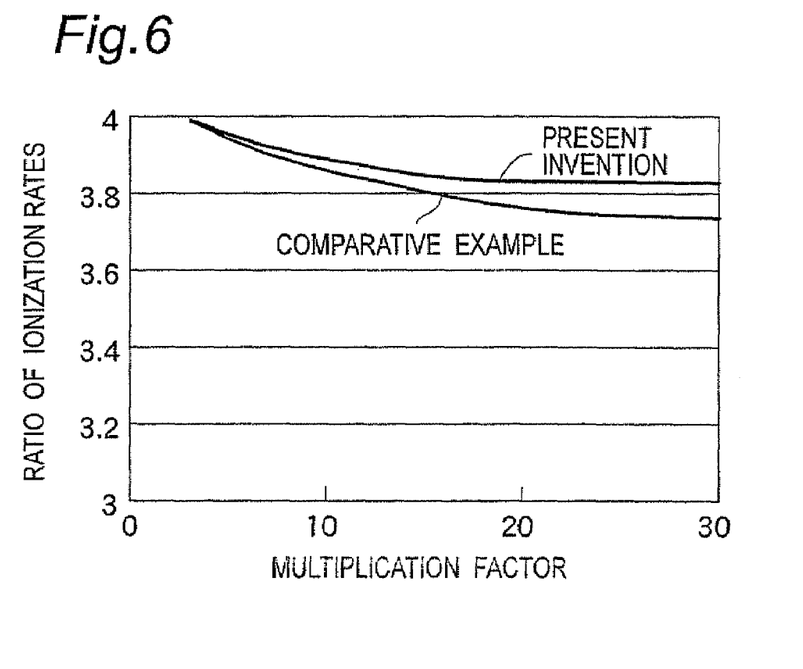
FIG. 6 is a graph showing the relation between the multiplication factor of the multiplication layer 6 and the ratio of ionization rates in an avalanche photodiode in an embodiment 1 in contrast to that of a comparative example.

Next, in the structures of the embodiment 1 and comparative example, the relation between the multiplication factor in the i-type AlInAs multiplication layer 6 and the multiplication factor in the i-type InGaAs light-absorbing layer 4 is shown in FIG. 5. It is found that as shown in FIG. 5, the multiplication factor of the i-type InGaAs light-absorbing layer 4 is suppressed even in the range where the multiplication factor in the AlInAs multiplication layer 6 is high in the avalanche photodiode of the embodiment 1 into which the InGaAs multiplication layer 3 is inserted. It is also found that as shown in FIG. 6, the ratio of ionization rates is improved by inserting the InGaAs multiplication suppressing layer 3 on viewing from the relation between the multiplication factor and the ratio of ionization rates.

Figure 7:
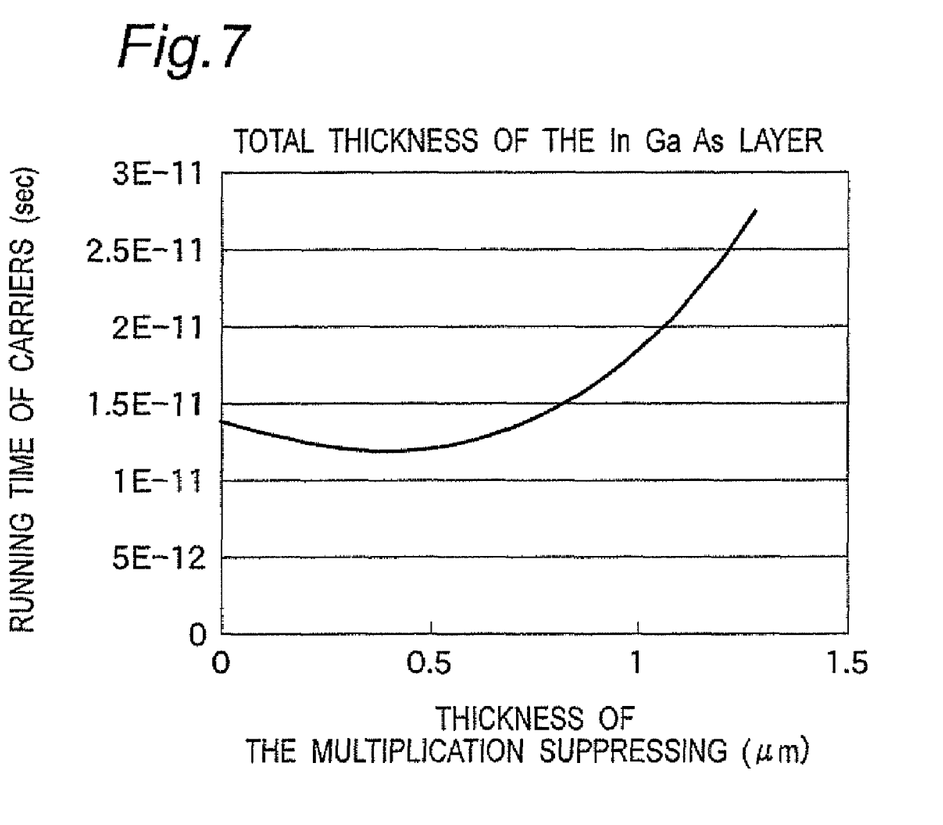
FIG. 7 is a graph showing carrier running time in relation to the thickness of a multiplication suppressing layer in the avalanche photodiode of embodiment 1.

Next, FIG. 7 shows the results of calculation as to the relation between the thickness of the InGaAs multiplication suppressing layer 3 and the running time of carriers. It is found from this FIG. 7 that in the case where the total thickness of the InGaAs absorbing layer 4 and InGaAs multiplication suppressing layer 3 is set to 1.3 µm, the thickness of the InGaAs multiplication suppressing layer 3 is designed to be preferably 0.6 µm or less and more preferably 0.45 µm or less to thereby shorten the running time of carriers. In other words, the band defined by the running time of carriers is improved. Specifically, the carriers generated in the multiplication suppressing layer 3 are diffused, reach the depleted layer and then drawn as signals. However, when the thickness of the multiplication suppressing layer is 0.60 µm or less, the time required to draw electrons as signals is made shorter than in the case of using only drift, which more improves high-speed response characteristics, frequency characteristics and GB product.

In this case, the lower limit of the InGaAs multiplication suppressing layer 3 is designed taking the multiplication suppressing effect into account, and for example, designed to be 0.1 µm or more.

It is found from the above result that the insertion of the InGaAs multiplication suppressing layer 3 prepared by adding impurities to the InGaAs light-absorbing layer makes it possible to improve the ratio of ionization rates and to shorten the running time of carriers. It is found that this can make improvements in band-broadening of elements and GE product (gain-bandwidth product) and also in high-speed response characteristics.

Next, the avalanche photodiode of the embodiment 1 and the avalanche photodiode of the comparative example were produced experimentally and evaluated. The results are shown below.

It is to be noted that in the avalanche photodiode of the embodiment 1, the total thickness of the InGaAs absorbing layer 4 and InGaAs multiplication suppressing layer 3 was set to 1.3 µm and in the avalanche photodiode of the comparative example in which no InGaAs multiplication suppressing layer is inserted, the thickness of i-type InGaAs absorbing layer was set to 1.3 µm to make equal the total thickness of the InGaAs absorbing layer.

Figure 8:
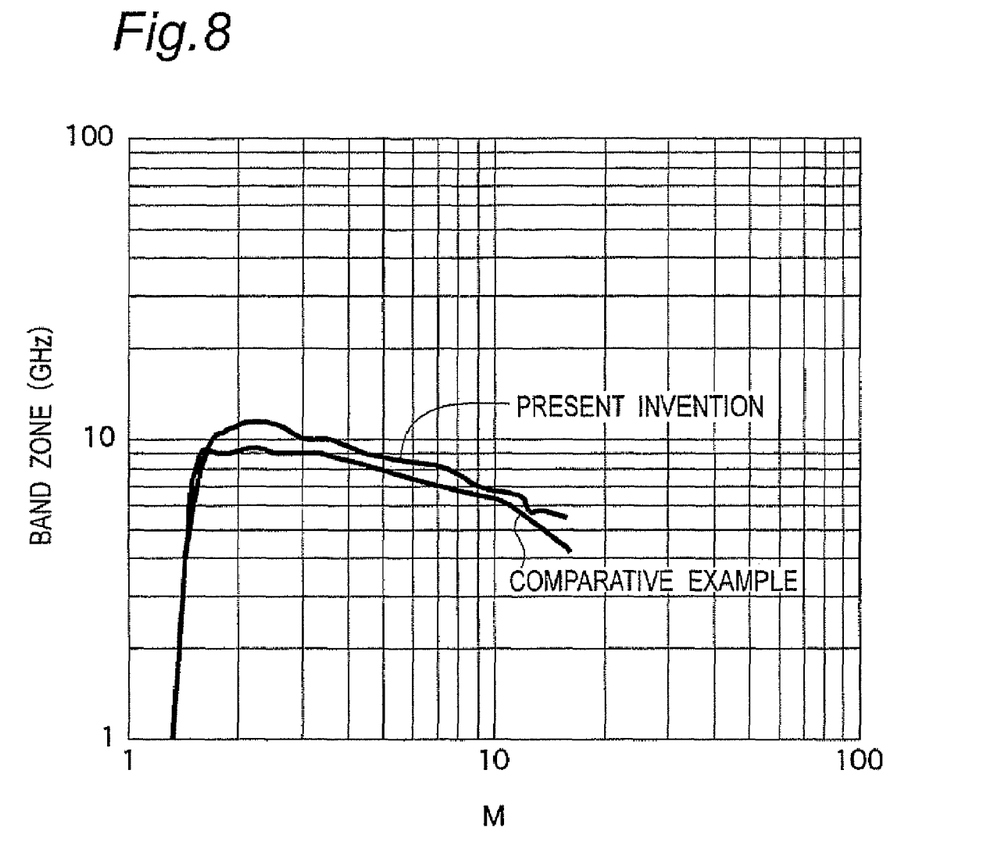
FIG. 8 is a graph showing the frequency characteristics of the avalanche photodiode of embodiment 1 in contrast to that of a comparative example.

The frequency characteristics of the experimentally produced avalanche photodiode of the embodiment 1 and avalanche photodiode of the comparative example are shown in FIG. 8. As is clear from FIG. 8, the insertion of the InGaAs multiplication suppressing layer 3 ensures that higher cut-off frequencies are obtained and a high GS product is also obtained in almost all region.

Generally, because a depleted region is narrowed when the InGaAs multiplication suppressing layer 3 is inserted, resulting in an increase in electrostatic capacity of elements, leading to a deterioration in the cut-off frequency determined by elemental capacitance and elemental resistance among the factors determining the cut-off frequency. The above improvement in high-speed response characteristics in the avalanche photodiode of the embodiment 1 irrespective of this fact is considered to be due to the shortening of the running time of carriers and to the improvement in the ratio of ionization rates.

As to also the sensitivity characteristics of the avalanche photodiode of the embodiment 1, any deterioration in sensitivity which was caused by the formation of the region to which impurities were added was not observed and therefore an efficiency as high as 0.85 A/W was obtained. This showed that carriers were not recombined in the InGaAs multiplication suppressing layer 3 and almost all the generated carriers were drawn as signals.

In the avalanche photodiode of the embodiment 1 as mentioned above, impurities in the InGaAs multiplication suppressing layer 3 preferably have such a concentration gradient such that the concentration of impurities on the InGaAs absorbing layer 4 side is lower.

If the InGaAs multiplication suppressing layer 3 is constituted of a p-type graded InGaAs layer having impurity concentration gradient, electrons generated in the multiplication suppressing layer 3 are accelerated by an internal electric field and can move at a very high velocity. Therefore, the time required to draw these electrons as signals is shortened, leading to an improvement in high-speed response characteristics and to a more improvement in frequency characteristics.

It is more preferable that the impurity concentration gradient of the multiplication suppressing layer 3 be controlled such that the internal electric field is close to 4000 V/cm.

Also, though the multiplication layer 6 may be constituted of various semiconductors, it is constituted of, preferably, a semiconductor layer containing Al or more preferably a semiconductor layer containing Si, whereby the ratio of ionization rates can be increased. Also, a multiplication layer having a super lattice structure may be constituted using a semiconductor containing Al. A large ratio of ionization rates may also be obtained using a multiplication layer having a super lattice structure.

Embodiment 2

Figure 9:
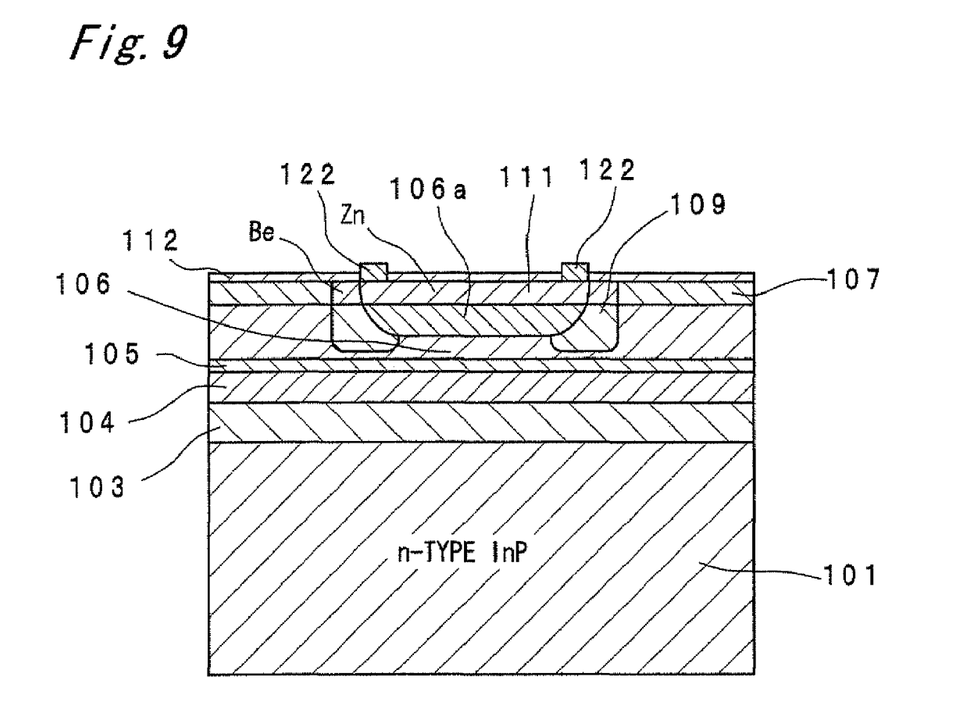
FIG. 9 is a sectional view of an avalanche photodiode in an embodiment 2 according to the present invention.

FIG. 9 is a sectional view showing the elemental structure of an avalanche photodiode having a multiplication layer comprising i-type InP.

A process of producing the avalanche photodiode of the embodiment 2 will be briefly explained to clarify the structure of the avalanche photodiode of the embodiment 2.

In this method, first an n-type InGaAs multiplication suppressing layer 103 (Si: $1 \times 10^{18}$ cm$^{-3}$), an i-type InGaAs light-absorbing layer 104, an i-type InGaAsP layer 105, an i-type InP multiplication layer 106 and an i-type InGaAs contact layer 107 are respectively formed one by one on an n-type InP substrate 101 by epitaxial growth (impurities to be added to the crystal and the concentration of the impurities are shown in the above parentheses). As the crystal growth method, solid source or gas source MBE, metalorganic chemical vapor deposition (MOCVD) method or the like is preferably used.

Next, the cyclic groove region is implanted with Be ions, followed by heat treating to activate these ions, thereby forming a low-concentration p-type region 109 in the vicinity of the light-receiving region, allowing this region to function as a guard ring. The same effect is obtained by using an element such as Mg or C other than the aforementioned Be as the type of ion to be implanted.

Next, Zn is used as an impurity source and diffused selectively to the light receiving section by a thermal diffusion method to transform the i-type InP layer 106 and the i-type InGaAs contact layer 107 into a p-type InP layer 106a and a p-type InGaAs contact layer 111. Here, the diffused depth of Zn is controlled so that the i-type InP layer is left between the p-type InP layer 106a and the i-type InGaAsP layer 105. This i-type InP layer in which Zn is not diffused functions as the multiplication layer 106.

Next, parts of the p-type InGaAs contact layer 111 are removed by selective etching to make the layer into a desired shape. Then, an antireflection film/passivation film 112 made of, for example, SiN$_x$ is formed on the surface of the wafer.

In succession, in the region where the surface passivation film 112 is selectively removed on a upper part of the p-type InGaAs contact layer 111 formed into a desired shape, an electrode 22 is formed on the p-type InGaAs contact layer 111 which is the light-receiving region by using an alloy such as AuZn, AuTi or AuTiPt.

The avalanche photodiode of the embodiment 2 as shown in FIG. 9 is completed through the steps as mentioned above.

In the avalanche photodiode of the embodiment 2 which is constituted in the above manner, Si as impurities to be minority carriers (holes in this case) that are multiplied in the InP multiplication layer is added to the i-type InGaAs absorbing layer 104 in the same manner as in the case of the embodiment 1. As shown in FIG. 9, the carriers multiplied in the i-type InGaAs absorbing layer 104 are decreased by inserting the n-type InGaAs multiplication suppressing layer 103 also in this embodiment 2. The ratio of ionization rates are thereby expected to be improved and also the effect of reducing the running time of carriers can be expected. These effects ensure improvements in noise characteristics and high-speed response characteristics.

The preferable ranges of each film thickness and total film thickness of the n-type InGaAs multiplication suppressing layer 103 and the i-type InGaAs absorbing layer 104 in the embodiment 2 are the same as those in the embodiment 1.

Also in the avalanche photodiode of the embodiment 2, the n-type InGaAs multiplication suppressing layer 103 preferably has such an impurity concentration gradient that the impurity concentration on the InGaAs absorbing layer 104 side is lower. Electrons generated in the multiplication suppressing layer 103 are thereby accelerated by an internal electric field and can move at a very high velocity.

Embodiment 3

Figure 10:
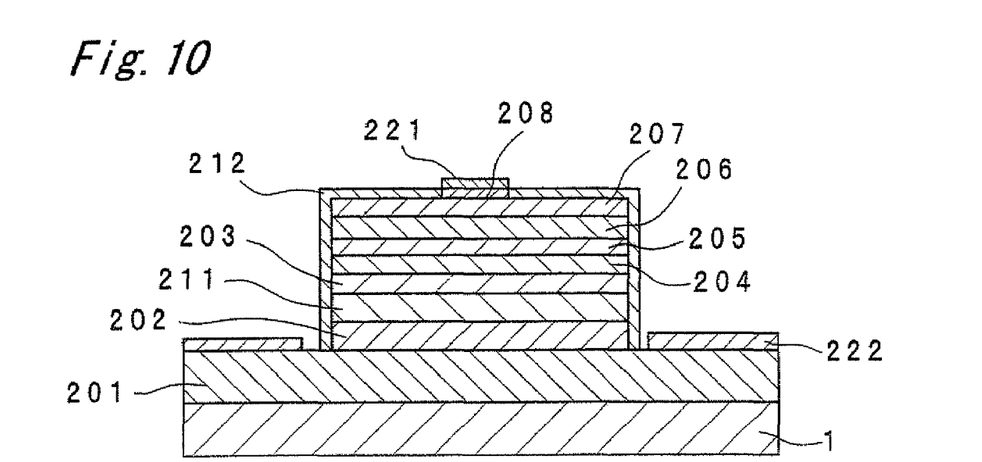
FIG. 10 is a sectional view of an avalanche photodiode in an embodiment 3 according to the present invention.

In the embodiments 1 and 2, the structure in which light is incident from the upper surface of the element is described by way of explaining the process of producing the element. A semiconductor light-receiving element generically called a waveguide type avalanche photodiode in which light is incident from the element side (cleavage plane side) as shown in FIG. 10 can be expected to be improved in the ratio of ionization rates by inserting the InGaAs multiplication suppressing layer 203.

The avalanche photodiode of the embodiment 3 is produced in the following manner.

First, a p-type InGaAs conductive layer 201, a p-type InP layer 202, a p-type InGaAsP light-confining layer 211, a p-type InGaAs multiplication suppressing layer 203, an i-type InGaAs light-absorbing layer 204, a p-type InGaAsP field limiting layer 205, an i-type AlInAs multiplication layer 206, an n-type InP layer 207 and an n-type InGaAs contact layer 208 are respectively formed by epitaxial growth on a semi-insulation InP substrate 1 to which Fe is added as impurities. As the crystal growth method, solid source or gas source MBE, metalorganic chemical vapor deposition (MOCVD) method or the like is preferably used.

After each layer is grown, a laminate part constituting the light-receiving section is left and the outside of the laminate part is etched until the p-type InGaAs conductive layer 201 is exposed.

Then, an anode electrode is formed on the exposed p-type InGaAs conductive layer 201, a cathode electrode 221 is formed on the n-type InGaAs contact layer 208 and the laminate part is entirely coated with a passivation film 212 made of, for example, $SiN_x$.

Like the avalanche photodiodes obtained in the embodiments 1 and 2, the avalanche photodiode (FIG. 10) of the embodiment 3 constituted in the above manner can be improved in the ratio of ionization rates since it is provided with the InGaAs multiplication suppressing layer 203 and also, the running time of carriers is shortened, which makes it possible to improve noise characteristics and high-speed response characteristics.

The preferable ranges of each film thickness and total film thickness of the multiplication suppressing layer 203 and the light-absorbing layer 204 in the embodiment 3 are the same as those in the embodiment 1.

Also in the avalanche photodiode of the embodiment 3, the p-type InGaAs multiplication suppressing layer 203 preferably has such an impurity concentration gradient that the impurity concentration on the light-absorbing layer 204 side is lower. Electrons generated in the multiplication suppressing layer 203 are thereby accelerated by an internal electric field and can move at a very high velocity.

What is claimed is:

1. An avalanche photodiode comprising:
a first conductivity type semiconductor layer,
a second conductivity type semiconductor layer,
a semiconductor multiplication layer interposed between the first conductivity type semiconductor layer and the second conductivity type semiconductor layer,
a semiconductor light-absorbing layer interposed between the semiconductor multiplication layer and the second conductivity type semiconductor layer, and
a multiplication suppressing layer which suppresses multiplication of charge carriers in the semiconductor light-absorbing layer and has a thickness not exceeding 0.6 µm, located between the semiconductor light-absorbing layer and the second conductivity type semiconductor layer.

2. An avalanche photodiode comprising:
a first conductivity type semiconductor layer,
a second conductivity type semiconductor layer,
a semiconductor multiplication layer interposed between the first conductivity type semiconductor layer and the second conductivity type semiconductor layer,
a semiconductor light-absorbing layer interposed between the semiconductor multiplication layer and the second conductivity type semiconductor layer,
a multiplication suppressing layer which suppresses multiplication of charge carriers in the semiconductor light-absorbing layer, located between the semiconductor light-absorbing layer and the second conductivity type semiconductor layer, and
a field limiting layer between the semiconductor light-absorbing layer and the multiplication layer.

* * * * *